United States Patent
Liu et al.

(10) Patent No.: US 12,453,209 B2
(45) Date of Patent: Oct. 21, 2025

(54) SOLAR CELL AND MANUFACTURING METHOD THEREOF, PHOTOVOLTAIC MODULE, AND PHOTOVOLTAIC SYSTEM

(71) Applicant: TRINA SOLAR CO., LTD., Changzhou (CN)

(72) Inventors: Chengfa Liu, Changzhou (CN); Hong Chen, Changzhou (CN); Daming Chen, Changzhou (CN); Yifeng Chen, Changzhou (CN)

(73) Assignee: TRINA SOLAR CO., LTD., Changzhou (CN)

( * ) Notice: Subject to any disclaimer, the term of this patent is extended or adjusted under 35 U.S.C. 154(b) by 0 days.

(21) Appl. No.: 18/754,287

(22) Filed: Jun. 26, 2024

(65) Prior Publication Data

US 2024/0347653 A1 Oct. 17, 2024

(30) Foreign Application Priority Data

Jul. 20, 2023 (CN) .......................... 202310892241.0

(51) Int. Cl.
*H10F 77/70* (2025.01)
*H10F 77/30* (2025.01)

(52) U.S. Cl.
CPC ......... *H10F 77/703* (2025.01); *H10F 77/311* (2025.01)

(58) Field of Classification Search
None
See application file for complete search history.

(56) References Cited

U.S. PATENT DOCUMENTS

| | | |
|---|---|---|
| 2012/0090673 A1 | 4/2012 | Dimitrov et al. |
| 2013/0032206 A1 | 2/2013 | Yokosawa et al. |
| 2013/0048073 A1 | 2/2013 | Karakida |

(Continued)

FOREIGN PATENT DOCUMENTS

| | | |
|---|---|---|
| CN | 109638103 A | 4/2019 |
| CN | 110534595 A | 12/2019 |

(Continued)

OTHER PUBLICATIONS

Machine translation of WO2017197811A1 (Year: 2017).*

(Continued)

*Primary Examiner* — Tamir Ayad
(74) *Attorney, Agent, or Firm* — MARSHALL, GERSTEIN & BORUN LLP

(57) ABSTRACT

A solar cell includes: a substrate including a first surface and a second surface arranged opposite to each other and a plurality of lateral surfaces adjacent to and located between the first surface and the second surface; a plurality of pyramid base shaped textured structures being constructed on the second surface and each of the lateral surfaces, wherein a minimum side length of each of top surfaces of the pyramid base shaped textured structures arranged on the lateral surfaces is L1, a maximum side length of each of top surfaces of the pyramid base shaped textured structures arranged on the second surface is L2, and L1>L2; a doped conductive layer arranged on the first surface; and a passivated contact layer including a polysilicon doped conductive layer, the passivated contact layer being arranged on the second surface.

19 Claims, 5 Drawing Sheets

(56) References Cited

U.S. PATENT DOCUMENTS

| | | | |
|---|---|---|---|
| 2013/0153025 A1 | 6/2013 | Hahn et al. | |
| 2014/0096821 A1* | 4/2014 | Chen | H01L 31/0352 |
| | | | 438/96 |
| 2014/0285224 A1* | 9/2014 | Albuschies | G01N 33/483 |
| | | | 438/49 |
| 2015/0364616 A1 | 12/2015 | Tohoda | |
| 2016/0322522 A1 | 11/2016 | Hirose et al. | |
| 2020/0343404 A1* | 10/2020 | Lee | H01L 31/1892 |
| 2022/0376124 A1 | 11/2022 | Feng et al. | |
| 2023/0083659 A1 | 3/2023 | Wu et al. | |

FOREIGN PATENT DOCUMENTS

| | | |
|---|---|---|
| CN | 113594296 A | 11/2021 |
| CN | 111244208 B | 2/2022 |
| CN | 115360262 A | 11/2022 |
| CN | 116314382 A | 6/2023 |
| CN | 116404071 A | 7/2023 |
| JP | 2006286820 A | 10/2006 |
| JP | 2021057435 A | 4/2021 |
| KR | 101740524 B1 | 6/2017 |
| WO | WO-2014/064769 A1 | 5/2014 |
| WO | WO-2017197811 A1 * | 11/2017 ......... H01L 31/0236 |
| WO | WO-2022/105951 A1 | 5/2022 |
| WO | WO-2022144214 A1 | 7/2022 |

OTHER PUBLICATIONS

Machine translation of CN113594296A (Year: 2021).*
Decision of Grant, Chinese Patent Application No. 202310892241.0, dated Aug. 29, 2023.
Office Action, Australian patent application No. 2024204865, dated Sep. 9, 2024.
Office Action, Brazilian patent application No. BR102024014866-5, mailing date Apr. 1, 2025.
European Search Report for European Patent Application No. 24178573.2, dated Dec. 20, 2024.

* cited by examiner

Providing a base plate, the base plate including a substrate, pyramid shaped textured structures being constructed on surfaces of the substrate, element-doped conductive material layers being stacked on the surfaces of the substrate, the surfaces of the substrate including a first surface and a second surface arranged opposite to each other and a plurality of lateral surfaces adjacent to and located between the first surface and the second surface. — S10

Etching and removing the element-doped conductive material layers on the second surface and the lateral surfaces, and etch the pyramid shaped textured structures on the second surface and the lateral surfaces into pyramid base shaped textured structures, to form a doped conductive layer on the first surface of the substrate. — S20

Forming a passivated contact material layer on the second surface of the substrate, the passivated contact material layer including a polysilicon doped conductive material layer. — S30

Etching and removing the passivated contact material layer wraparound deposited on a side of the first surface and the lateral surfaces of the substrate and etching the pyramid base shaped textured structures on the lateral surfaces to form a passivated contact layer on the second surface, with a minimum side length L1 of each of top surfaces of the pyramid base shaped textured structures arranged on the lateral surfaces and a maximum side length L2 of each of top surfaces of the pyramid base shaped textured structures arranged on the second surface satisfying: L1 > L2. — S40

FIG. 4

SOLAR CELL AND MANUFACTURING METHOD THEREOF, PHOTOVOLTAIC MODULE, AND PHOTOVOLTAIC SYSTEM

CROSS-REFERENCE TO RELATED APPLICATIONS

This application claims priority to Chinese patent application No. 2023108922410, filed on Jul. 20, 2023, the content of which is hereby incorporated by reference in its entirety.

TECHNICAL FIELD

The present disclosure relates to the field of solar cell technologies, and in particular, to a solar cell and a manufacturing method thereof, a photovoltaic module, and a photovoltaic system.

BACKGROUND

With the rapid development of photovoltaic technologies, conversion efficiency of crystalline silicon solar cells is increasing year by year. At present, tunnel oxide passivated contact (TOPCon) cells stand out with lots of advantages such as high efficiency and high maturity of an industrial process. Many manufacturers in the industry have begun to increase research and development progress of the TOPCon cells. In the related art, during manufacturing of the TOPCon cells, there are doping processes on front and back surfaces of the cells, which easily causes the problem of leakage on lateral surfaces of the cells, thereby reducing efficiency of the solar cells.

SUMMARY

Based on this, there is a need to provide a solar cell and a manufacturing method thereof, a photovoltaic module, and a photovoltaic system which have a higher efficiency.

In a first aspect of the embodiments of the present disclosure, a solar cell is provided. The solar cell includes:
  a substrate including a first surface and a second surface arranged opposite to each other and a plurality of lateral surfaces adjacent to and located between the first surface and the second surface; a plurality of pyramid base shaped textured structures being constructed on the second surface and each of the lateral surfaces, wherein a minimum side length of each of top surfaces of the pyramid base shaped textured structures arranged on the lateral surfaces is L1, a maximum side length of each of top surfaces of the pyramid base shaped textured structures arranged on the second surface is L2, and L1>L2;
  a doped conductive layer arranged on the first surface; and
  a passivated contact layer including a polysilicon doped conductive layer, the passivated contact layer being arranged on the second surface.

In an embodiment, the minimum side length L1 of each of the top surfaces of the pyramid base shaped textured structures arranged on the lateral surfaces satisfies: L1>15 µm.

In an embodiment, any side length L3 of each of the top surfaces of the pyramid base shaped textured structures arranged on the lateral surfaces satisfies: 15 µm<L3≤40 µm.

In an embodiment, the maximum side length L2 of each of the top surfaces of the pyramid base shaped textured structures arranged on the second surface satisfies: L2<15 µm.

In an embodiment, any side length L4 of each of the top surfaces of the pyramid base shaped textured structures arranged on the second surface satisfies: 7 µm≤L4≤10 µm.

In an embodiment, a top end of the pyramid base shaped textured structures is provided with depressions, and a depression depth D of each of the depressions satisfies: 50 nm≤D≤1000 nm.

In an embodiment, the solar cell further includes:
  a first passivation film layer stacked on the doped conductive layer; and
  a second passivation film layer stacked on the passivated contact layer.

In a second aspect of the embodiments of the present disclosure, a solar cell is provided. The solar cell includes:
  a substrate including a first surface and a second surface arranged opposite to each other and a plurality of lateral surfaces adjacent to and located between the first surface and the second surface; a plurality of pyramid base shaped textured structures being constructed on the second surface and each of the lateral surfaces, wherein a perimeter of each of top surfaces of the pyramid base shaped textured structures arranged on the lateral surfaces is C1, a perimeter of each of top surfaces of the pyramid base shaped textured structures arranged on the second surface is C2, and C1>C2;
  a doped conductive layer arranged on the first surface; and
  a passivated contact layer including a polysilicon doped conductive layer, the passivated contact layer being arranged on the second surface.

In a third aspect of the embodiments of the present disclosure, a manufacturing method of a solar cell is provided. The manufacturing method includes:
  providing a base plate, the base plate including a substrate, pyramid shaped textured structures being constructed on surfaces of the substrate, element-doped conductive material layers being stacked on the surfaces of the substrate, the surfaces of the substrate including a first surface and a second surface arranged opposite to each other and a plurality of lateral surfaces adjacent to and located between the first surface and the second surface;
  etching and removing the element-doped conductive material layers on the second surface and the lateral surfaces, and etching the pyramid shaped textured structures on the second surface and the lateral surfaces into pyramid base shaped textured structures, to form a doped conductive layer on the first surface of the substrate;
  forming a passivated contact material layer on the second surface of the substrate, the passivated contact material layer including a polysilicon doped conductive material layer; and
  etching and removing the passivated contact material layer wraparound deposited on a side of the first surface and the lateral surfaces of the substrate and etching the pyramid base shaped textured structures on the lateral surfaces to form a passivated contact layer on the second surface, with a minimum side length L1 of each of top surfaces of the pyramid base shaped textured structures arranged on the lateral surfaces and a maximum side length L2 of each of top surfaces of the pyramid base shaped textured structures arranged on the second surface satisfying: L1>L2.

In an embodiment, the element-doped conductive material layers each include an emitter material layer and a first oxide material layer located on a side of the emitter material layer that facing away from the pyramid shaped textured structures; and the step of etching and removing the element-doped conductive material layers on the second surface and the lateral surfaces, and the etching the pyramid shaped textured structures on the second surface and the lateral surfaces into pyramid base shaped textured structures include:

etching and removing the first oxide material layers on the second surface and the lateral surfaces of the substrate in a chain machine; and etching and removing the emitter material layers on the second surface and the lateral surfaces of the substrate in a trough machine, and etching the pyramid shaped textured structures on the second surface and the lateral surfaces into the pyramid base shaped textured structures.

In an embodiment, in the step of etching and removing the first oxide material layers on the second surface and the lateral surfaces of the substrate in the chain machine, an HF solution with a concentration of 2% to 35% is used for etching in the step of the etching performed in the chain machine.

In an embodiment, in the step of etching and removing the emitter material layers on the second surface and the lateral surfaces of the substrate in the trough machine, and etching the pyramid shaped textured structures on the second surface and the lateral surfaces into the pyramid base shaped textured structures, a temperature under which the step of the etching is performed in the trough machine ranges from 45° C. to 90° C., and the etching is performed through a first etching solution; wherein the first etching solution includes a NaOH or KOH solution with a concentration of 5% to 20% and an organic complex additive.

In an embodiment, the organic complex additive includes a cationic surfactant, sodium glycolate, and sodium formate.

In an embodiment, the step of forming the passivated contact material layer on the second surface of the substrate includes:

sequentially stacking and forming a tunnel material layer, a polysilicon doped material layer, and a second oxide material layer on the second surface of the substrate; and the step of etching and removing the passivated contact material layer wraparound deposited on the side of the first surface and the lateral surfaces of the substrate and the etching the pyramid base shaped textured structures on the lateral surfaces include:

etching and removing the second oxide material layers wraparound deposited on the first surface and the lateral surfaces of the substrate in a chain machine; and etching and removing the tunnel material layer and the polysilicon doped material layer wraparound deposited on the first surface and the lateral surfaces of the substrate in a trough machine, and etching the pyramid base shaped textured structures on the lateral surfaces.

In an embodiment, in the step of etching and removing the tunnel material layer and the polysilicon doped material layer wraparound deposited on the first surface and the lateral surfaces of the substrate in the trough machine, and etching the pyramid base shaped textured structures on the lateral surfaces, the etching is performed through a second etching solution, wherein the second etching solution includes a KOH or NaOH solution with a concentration of 5% to 30%, and ethylenediaminetetraacetic acid disodium salt, polysaccharide, and sodium formate.

In a fourth aspect of the embodiments of the present disclosure, a photovoltaic module is provided. The photovoltaic module includes at least one cell string, the cell string includes at least two solar cells described above.

In a fifth aspect of the embodiments of the present disclosure, a photovoltaic system is provided. The photovoltaic system includes the photovoltaic module described above.

The solar cell and the manufacturing method thereof, the photovoltaic module, and the photovoltaic system have the following beneficial effects.

Since the pyramid base shaped textured structures are pyramid base shaped structures formed after the pyramid shaped textured structures are polished, if a side length of a top surface of each of the pyramid base shaped textured structures is longer, a protruding height of each of the pyramid base shaped textured structures correspondingly formed is lower, and a degree of etching is higher. On the contrary, if the side length of the top surface of each of the pyramid base shaped textured structures is shorter, the protruding height of each of the pyramid base shaped textured structures correspondingly formed is higher, and the degree of etching is lower. By making the minimum side length L1 of each of the top surfaces of the pyramid base shaped textured structures arranged on the lateral surfaces and the maximum side length L2 of each of the top surfaces of the pyramid base shaped textured structures arranged on the second surface satisfy: L1>L2, that is, making the side lengths of the top surfaces of the pyramid base shaped textured structures arranged on the lateral surfaces being all greater than the side lengths of the top surfaces of the pyramid base shaped textured structures arranged on the second surface, the heights of the pyramid base shaped textured structures formed on the lateral surfaces are lower than the heights of the pyramid base shaped textured structures formed on the second surface. That is, compared with the second surface, the lateral surfaces are etched to a higher degree. As such, during formation of the polysilicon doped conductive layer, portions of the lateral surfaces of the substrate where doping elements diffuse into can be removed by etching as much as possible, which can prevent formation of leakage channels on the lateral surfaces, thereby improving efficiency of the solar cell.

BRIEF DESCRIPTION OF THE DRAWINGS

FIG. 4 is a schematic flowchart of a manufacturing method of a solar cell according to an embodiment of the present disclosure;

REFERENCE SIGNS

Figure 1:
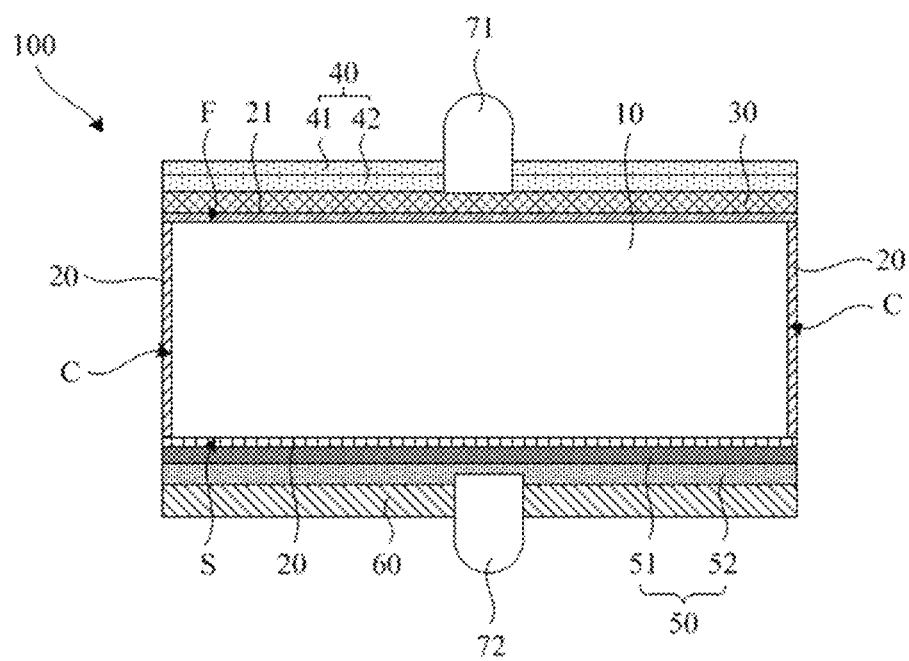
FIG. 1 is a schematic structural diagram of a solar cell according to an embodiment of the present disclosure.

100: solar cell; 101: base plate; F: first surface, S: second surface; C: lateral surface;
10: substrate; 20: pyramid base shaped textured structures, 21: textured layer; 22: pyramid shaped textured structures; 30: doped conductive layer; 31: element-doped conductive material layer; 40: first passivation film layer; 50: passivated contact layer; 51: tunnel oxide layer; 52: polysilicon doped conductive layer; 60: second passivation film layer;
71: first electrode; 72: second electrode.

DETAILED DESCRIPTION

In order to make the objectives, technical solutions, and advantages of the present disclosure clearer, specific implementations of the present disclosure will be described below in detail with reference to the accompanying drawings. In the following description, many specific details are set forth in order to fully understand the present disclosure. However, the present disclosure can be implemented in many other ways different from those described herein, and those skilled in the art can make similar improvements without departing from the connotation of the present disclosure. Therefore, the present disclosure is not limited by specific embodiments disclosed below.

In the description of the present disclosure, it should be understood that the orientation or position relationships indicated by the terms "center", "longitudinal", "transverse", "length", "width", "thickness", "upper", "lower", "front", "back", "left", "right", "vertical", "horizontal", "top", "bottom", "inner", "outer", "clockwise", "counter-clockwise", "axial", "radial", "circumferential", and the like are based on the orientation or position relationships shown in the accompanying drawings and are intended only to facilitate the description of the present disclosure and simplify the description, rather than indicating or implying that the apparatus or element referred to must have a particular orientation or be constructed and operated in a particular orientation, and therefore are not to be interpreted as limiting the present disclosure.

In addition, the terms "first" and "second" are used for descriptive purposes only, which cannot be construed as indicating or implying a relative importance, or implicitly specifying the number of the indicated technical features. Thus, the features defined with "first" and "second" may explicitly or implicitly include one or more features. In the description of the present disclosure, "a plurality of" means two or more, such as two or three, unless specifically stated otherwise.

In the description of the present disclosure, unless specifically stated and limited otherwise, the terms "mount," "join," "connect", and "fix" should be understood in a broad sense, such as, a fixed connection, a detachable connection, or an integral connection; a mechanical connection, or an electrical connection; or a direct connection, an indirect connection through an intermediate medium, an internal connection between two elements, or interaction between two elements. For those of ordinary skill in the art, the specific meanings of the foregoing terms in the present disclosure can be understood on a case-by-case basis.

In the present disclosure, unless otherwise explicitly specified and defined, the expression a first feature being "on" or "under" a second feature may be the case that the first feature is in direct contact with the second feature, or the first feature is in indirect contact with the second feature via an intermediate medium. Furthermore, the expression the first feature being "over", "above", and "on top of" the second feature may be the case that the first feature is directly above or obliquely above the second feature, or only means that the level of the first feature is higher than that of the second feature. The expression the first feature being "below", "underneath", or "under" the second feature may be the case that the first feature is directly underneath or obliquely underneath the second feature, or only means that the level of the first feature is lower than that of the second feature.

It should be noted that when one element is referred to as being "fixed to" or "arranged on" another element, it may be directly arranged on the another element or an intermediate element may exist. When one element is considered to be "connected to" another element, it may be directly connected to the another element or an intermediate element may co-exist. The terms "vertical", "horizontal", "up", "down", "left", "right", and similar expressions used herein are for illustrative purposes only, and do not represent unique implementations.

A solar cell and a manufacturing method thereof, a photovoltaic module, and a photovoltaic system according to embodiments of the present disclosure are described below with reference to the accompanying drawings.

Figure 2:
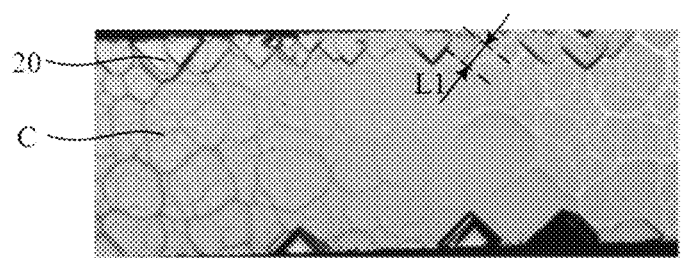
FIG. 2 is a schematic structural diagram of a lateral surface of a substrate in the solar cell according to an embodiment of the present disclosure.
Figure 3:
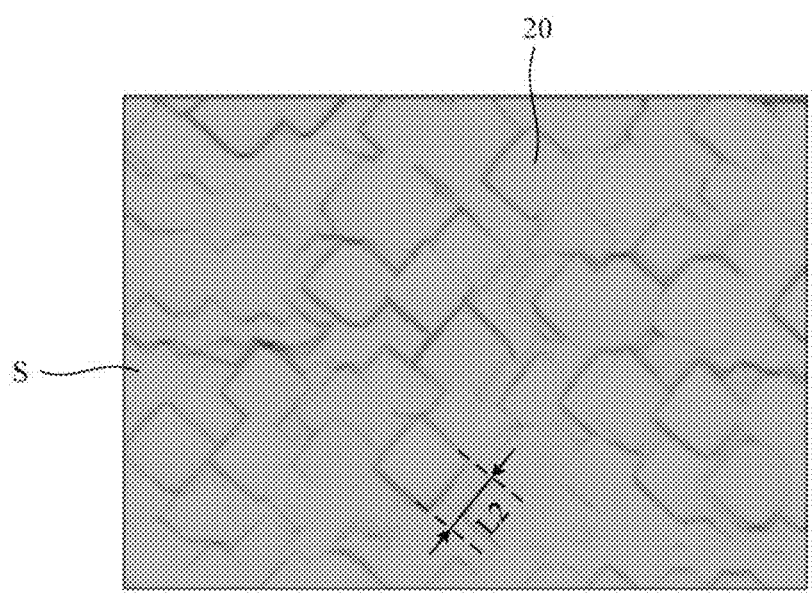
FIG. 3 is a schematic structural diagram of a second surface of the substrate in the solar cell according to an embodiment of the present disclosure.

FIG. 1 is a schematic structural diagram of a solar cell according to an embodiment of the present disclosure, FIG. 2 is a schematic structural diagram of a lateral surface of a substrate in the solar cell according to an embodiment of the present disclosure, and FIG. 3 is a schematic structural diagram of a second surface of the substrate in the solar cell according to an embodiment of the present disclosure.

Referring to FIG. 1, FIG. 2, and FIG. 3, in an aspect of the embodiments, a solar cell 100 is provided. The solar cell 100 includes a substrate 10, a doped conductive layer 30, and a passivated contact layer 50.

The substrate 10 includes a first surface F and a second surface S arranged opposite to each other and a plurality of lateral surfaces C adjacent to and located between the first surface F and the second surface S. A plurality of pyramid base shaped textured structures 20 are constructed on the second surface S and each of the lateral surfaces C. A minimum side length of each of top surfaces of the pyramid base shaped textured structures 20 arranged on the lateral surfaces C is L1, a maximum side length of each of top surfaces of the pyramid base shaped textured structures 20 arranged on the second surface S is L2, and L1>L2. The doped conductive layer 30 is arranged on the first surface F. The passivated contact layer 50 includes a polysilicon doped conductive layer 52. The passivated contact layer 50 is arranged on the second surface S.

Since the pyramid base shaped textured structures 20 are pyramid base shaped structures formed after the pyramid shaped textured structures 22 are polished, if a side length of a top surface of each of the pyramid base shaped textured structures 20 is longer, a protruding height of each of the pyramid base shaped textured structures 20 correspondingly formed is lower, and a degree of etching is higher. On the contrary, if the side length of the top surface of each of the pyramid base shaped textured structures 20 is shorter, the protruding height of each of the pyramid base shaped textured structures 20 correspondingly formed is higher, and the degree of etching is lower. By making the minimum side length L1 of each of the top surfaces of the pyramid base shaped textured structures 20 arranged on the lateral surfaces C and the maximum side length L2 of each of the top surfaces of the pyramid base shaped textured structures 20 arranged on the second surface S satisfy: L1>L2, that is, making the side lengths of the top surfaces of the pyramid base shaped textured structures 20 arranged on the lateral surfaces C being all greater than the side lengths of the top surfaces of the pyramid base shaped textured structures 20 arranged on the second surface S, the heights of the pyramid base shaped textured structures 20 formed on the lateral surfaces C are lower than the heights of the pyramid base shaped textured structures 20 formed on the second surface S. That is, compared with the second surface S, the lateral surfaces C are etched to a higher degree. As such, during formation of the polysilicon doped conductive layer 52, portions of the lateral surfaces C of the substrate 10 where doping elements diffuse into can be removed by etching as much as possible, which can prevent formation of leakage channels on the lateral surfaces C, thereby improving efficiency of the solar cell 100.

It may be understood that since each of the pyramid base shaped textured structures 20 is formed by etching a pyramid shaped textured structure, the each of the pyramid base shaped textured structures 20 may be in a shape of a truncated pyramid, such as a truncated triangular pyramid or a truncated quadrangular pyramid. The top surface of the pyramid base shaped textured structure 20 is a polygonal figure (including a case where the top of the pyramid base shaped textured structure 20 may be approximately regarded as a plane figure, and a case where the top of the pyramid base shaped textured structure 20 is a plane figure). Herein, the side length of the top surface of the pyramid base shaped textured structure 20 refers to a side length of the polygonal figure. In the embodiments of the present disclosure, the top surface of the pyramid base shaped textured structure 20 may be in a shape of a triangle, a quadrangle, or the like depending on the number of sides in the truncated pyramid. The minimum side length of the top surface of the pyramid base shaped textured structure 20 refers to the shortest side length in side lengths of the polygonal top surface of the pyramid base shaped textured structure 20. The maximum side length of the top surface of the pyramid base shaped textured structure 20 refers to the longest side length in the side lengths of the polygonal top surface of the pyramid base shaped textured structure 20.

Certainly, in a case where the top surface of the pyramid base shaped textured structure 20 is a regular polygon, all side lengths of the top surface are equal, thus the minimum side length of the top surface of the pyramid base shaped textured structure 20 refers to any side length of the polygonal top surface of the pyramid base shaped textured structure 20, and the maximum side length of the top surface of the pyramid base shaped textured structure 20 refers to any side length of the polygonal top surface of the pyramid base shaped textured structure 20.

In the embodiments of the present disclosure, the substrate 10 is configured to receive incident light and generate photogenerated carriers. Exemplarily, the solar cell 100 may be a TOPCon (Tunnel Oxide Passivated Contact) cell, and both the first surface F and the second surface S of the substrate 10 may be configured to receive incident light.

In an actual situation, the solar cell 100 may include an N-type cell and a P-type cell. The substrate 10 of the N-type cell is doped with an N-type element, and the doped conductive layer 30 of the N-type cell is doped with a P-type element. The substrate 10 of the P-type cell is doped with a P-type element, and the doped conductive layer 30 of the P-type cell is doped with an N-type element. The doped conductive layer 30 is configured to form a PN junction with the substrate 10. In the embodiments of the present disclosure, a case in which the substrate 10 is an N-type substrate 10 is used as an example for illustration. In this case, the doped conductive layer 30 may be P-type doped, which may be, for example, a boron-doped doped conductive layer 30 (also called a P+ type emitter).

Still referring to FIG. 1, the passivated contact layer 50 is arranged on the second surface S. For example, the passivated contact layer 50 may be directly stacked on the second surface S of the substrate 10. The passivated contact layer 50 may reduce recombinations of carriers on a surface of the substrate 10, thereby increasing an open-circuit voltage of the solar cell 100 and improving photoelectric conversion efficiency of the solar cell 100. The passivated contact layer 50 may include a tunnel oxide layer 51 and a polysilicon doped conductive layer 52 sequentially stacked on the second surface S. Exemplarily, the tunnel oxide layer 51 is configured to realize interface passivation on the second surface S of the substrate 10 to achieve a chemical passivation effect.

In the embodiments of the present disclosure, still referring to FIG. 1, the solar cell 100 may further include a first passivation film layer 40, a second passivation film layer 60, a first electrode 71, and a second electrode 72.

The first passivation film layer 40 is stacked on the doped conductive layer 30. The first passivation film layer 40 plays surface passivation and antireflection roles in the solar cell 100, may perform better chemical passivation on dangling bonds on the surface of the substrate 10, and plays an antireflection role on the front surface of the solar cell 100.

Exemplarily, the first passivation film layer 40 includes a first passivation layer 41 and a first antireflection layer 42 that plays an antireflection role, which are sequentially stacked on the doped conductive layer 30.

The second passivation film layer 60 is stacked on the passivated contact layer 50. The second passivation film layer 60 may also adopt a single-layer or multi-layer structure, and the second passivation film layer 60 may be made of silicon oxide, silicon nitride, or silicon oxynitride. The second passivation film layer 60 may play roles of passivation and antireflection at the same time.

The first electrode 71 is arranged on the first passivation film layer 40, and the second electrode 72 is arranged on the second passivation film layer 60. The first electrode 71 is electrically connected to the doped conductive layer 30. The second electrode 72 penetrates through the second passivation film layer 60 and is electrically connected to the passivated contact layer 50.

In the embodiments of the present disclosure, the minimum side length L1 of each of the top surfaces of the pyramid base shaped textured structures 20 arranged on the lateral surfaces C satisfies: L1>15 μm. Exemplarily, any side length L3 of each of the top surfaces of the pyramid base shaped textured structures 20 arranged on the lateral surfaces C satisfies: 15 μm<L3≤40 μm.

In this way, portions of the lateral surfaces C where doping elements diffuse into can be removed by etching as much as possible, thereby minimizing a possibility of electric leakage.

Further, the maximum side length L2 of each of the top surfaces of the pyramid base shaped textured structures 20 arranged on the second surface S satisfies: L2<15 µm. If L2 is greater than 15 µm, the second surface S is etched to an excessively large degree, making the second surface S relatively flat, which may lead to large contact resistance between the second electrode 72 and the second surface S of the substrate 10 and result in a poor current collection effect of the solar cell 100.

Further, any side length L4 of each of the top surfaces of the pyramid base shaped textured structures 20 arranged on the second surface S satisfies: 7 µm≤L4≤10 µm.

It may be understood that if L4 is less than 7 µm, the second surface S is etched to a relatively small degree, and the second surface S has poor flatness, which is not conducive to the passivated contact layer 50 to form close contact with the second surface S.

If L4 satisfies: 7 µm≤L4≤10 µm, the second surface S can be etched to a moderate degree, so that the passivated contact layer 50 can form good contact with the second surface S of the substrate 10, while the passivated contact layer 50 can have good adhesion, thereby reducing recombinations of photogenerated carriers on the back surface, prolonging a lifetime of minority carriers, and improving a passivation effect. On the other hand, contact resistance between a back electrode and the second surface S of the substrate 10 can also be reduced, so that the current collection effect of the solar cell 100 is better, and the efficiency of the solar cell 100 is also improved.

In the embodiments of the present disclosure, a top end of the pyramid base shaped textured structures 20 is provided with depressions, and a depression depth D of each of the depressions satisfies: 50 nm≤D≤1000 nm. In this way, the depression depth D can be within a reasonable range, so as to achieve a relative flat surface, reduce surface defect states, and improve passivation quality.

In a second aspect of the present disclosure, a manufacturing method of a solar cell is provided.

Figure 5:
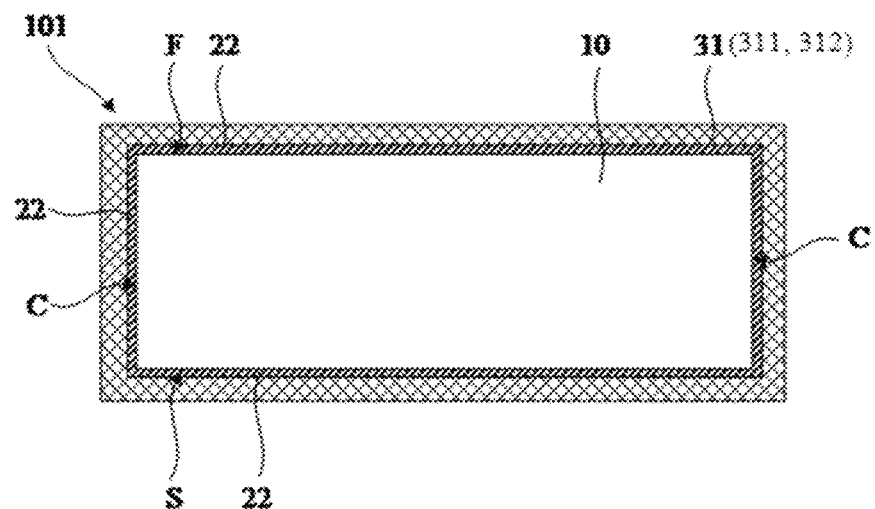
FIG. 5 is a schematic structural diagram of a base plate in the manufacturing method of a solar cell according to an embodiment of the present disclosure.
Figure 6:
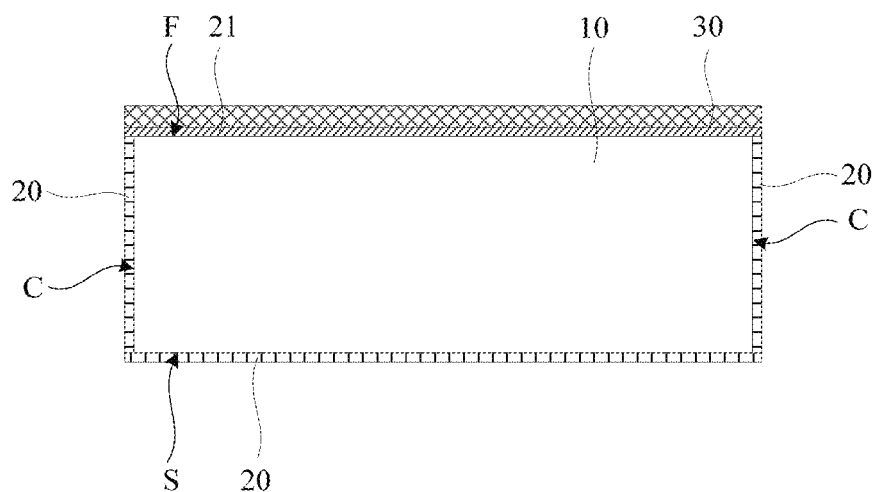
FIG. 6 is a schematic diagram of forming pyramid base shaped textured structures and a doped conductive layer on a substrate in the manufacturing method of a solar cell according to an embodiment of the present disclosure.
Figure 7:
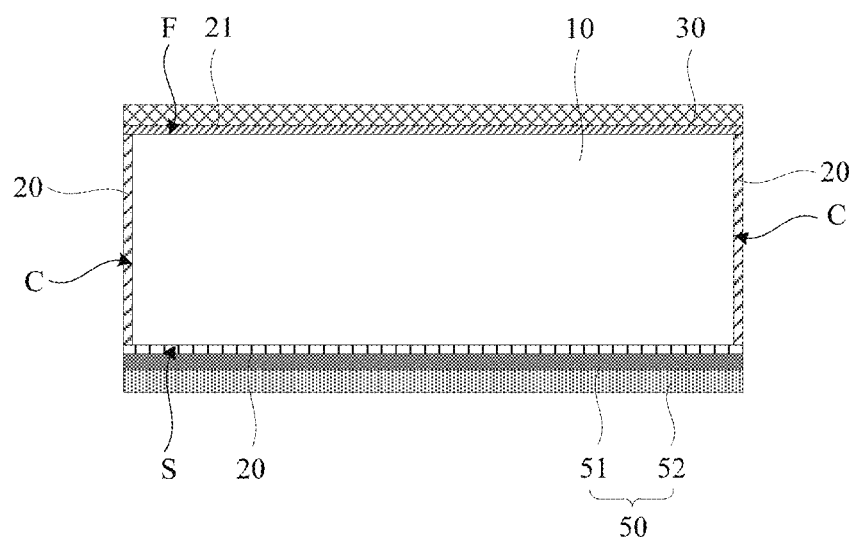
FIG. 7 is a schematic diagram of forming a passivated contact layer and forming pyramid base shaped textured structures on lateral surfaces of the substrate in the manufacturing method of a solar cell according to an embodiment of the present disclosure.
Figure 8:
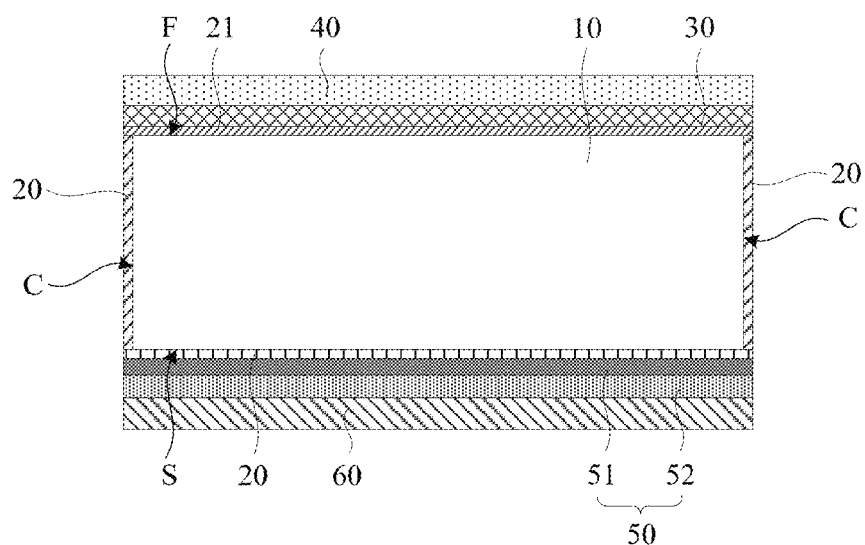
FIG. 8 is a schematic diagram of forming a first passivation film layer and a second passivation film layer in the manufacturing method of a solar cell according to an embodiment of the present disclosure.

FIG. 4 is a schematic flowchart of a manufacturing method of a solar cell according to an embodiment of the present disclosure; FIG. 5 is a schematic structural diagram of a base plate 101 in the manufacturing method of a solar cell according to an embodiment of the present disclosure; FIG. 6 is a schematic diagram of forming pyramid base shaped textured structures 20 and a doped conductive layer 30 on a substrate 10 in the manufacturing method of a solar cell according to an embodiment of the present disclosure; FIG. 7 is a schematic diagram of forming a passivated contact layer 50 and forming pyramid base shaped textured structures 20 on lateral surfaces C of the substrate 10 in the manufacturing method of a solar cell according to an embodiment of the present disclosure; and FIG. 8 is a schematic diagram of forming a first passivation film layer 40 and a second passivation film layer 60 in the manufacturing method of a solar cell according to an embodiment of the present disclosure.

Referring to FIG. 4 to FIG. 8, the manufacturing method of a solar cell provided in the embodiments of the present disclosure includes the following steps.

In S10, a base plate 101 is provided, the base plate 101 includes a substrate 10, pyramid shaped textured structures 22 are constructed on surfaces of the substrate 10, element-doped conductive material layers 31 are stacked on the surfaces of the substrate 10, and the surfaces of the substrate 10 include a first surface F and a second surface S arranged opposite to each other and a plurality of lateral surfaces C adjacent to and located between the first surface F and the second surface S.

In S20, the element-doped conductive material layers 31 on the second surface S and the lateral surfaces C are etched and removed, and the pyramid shaped textured structures 22 on the second surface S and the lateral surfaces C are etched into pyramid base shaped textured structures 20, to form a doped conductive layer 30 on the first surface F of the substrate 10.

In S30, a passivated contact material layer is formed on the second surface S of the substrate 10, and the passivated contact material layer includes a polysilicon doped conductive material layer.

In S40, the passivated contact material layer wraparound deposited on one side of the first surface F and the lateral surfaces C of the substrate 10 are etched and removed and the pyramid base shaped textured structures 20 on the lateral surfaces C are etched to form a passivated contact layer 50 on the second surface S, such that a minimum side length L1 of each of top surfaces of the pyramid base shaped textured structures 20 arranged on the lateral surfaces C and a maximum side length L2 of each of top surfaces of the pyramid base shaped textured structures 20 arranged on the second surface S satisfy: L1>L2.

The pyramid shaped textured structures 22 on the second surface S and the lateral surfaces C are etched into pyramid base shaped textured structures 20, and in the subsequent steps, the pyramid base shaped textured structures 20 on the lateral surfaces C are continuously etched, so that the minimum side length L1 of each of the top surfaces of the pyramid base shaped textured structures 20 arranged on the lateral surfaces C and the maximum side length L2 of each of the top surfaces of the pyramid base shaped textured structures 20 arranged on the second surface S satisfy: L1>L2, and heights of the pyramid base shaped textured structures 20 formed on the lateral surfaces C are lower than heights of the pyramid base shaped textured structures 20 formed on the second surface S. That is, compared with the second surface S, the lateral surfaces C are etched to a higher degree. During formation of the polysilicon doped conductive material layer, portions of the lateral surfaces C of the substrate 10 where doping elements diffuse into may be removed by etching as much as possible, which can prevent formation of leakage channels on the lateral surfaces C, thereby improving efficiency of the solar cell 100.

In the embodiments of the present disclosure, the element-doped conductive material layers 31 each include an emitter material layer 311 and a first oxide material layer 312 located on a side of the emitter material layer 311 that facing away from the pyramid shaped textured structure 22. For example, when the first surface F of the substrate 10 is boron-diffused, an emitter material layer may be formed on the first surface F of the substrate 10, emitter material layers may be wraparound deposited on the second surface S and the lateral surfaces C, and a first oxide material layer (such as borosilicate glass (BSG), also known as a silicon dioxide layer) may also be formed on each surface of the emitter material layer, as shown in FIG. 5.

In step S20 above, referring to FIG. 5 and FIG. 6 together, the step of etching and removing the element-doped conductive material layers 31 on the second surface S and the lateral surfaces C, and etching the pyramid shaped textured structures 22 on the second surface S and the lateral surfaces C into pyramid base shaped textured structures 20 includes:

etching and removing the first oxide material layers on the second surface S and the lateral surfaces C of the substrate 10 in a chain machine; and etching and removing the emitter material layers on the second surface S and the lateral surfaces C of the substrate 10 in a trough machine, and etching the pyramid shaped textured structures 22 on the second surface S and the lateral surfaces C into the pyramid base shaped textured structures 20.

Further, in the step of etching and removing the first oxide material layers on the second surface S and the lateral surfaces C of the substrate 10 in a chain machine, an HF solution with a concentration of 2% to 35% is used for etching in the etching step performed in the chain machine. It may be understood that during the etching, in order to prevent an influence on the emitter material layer on the first surface F, an immersion height of the etching solution of the chain machine should be lower than the first surface F of the substrate 10. Therefore, herein, the first oxide material layers on the second surface S and most regions on the lateral surfaces C close to the second surface S are actually removed.

Further, in the step of etching and removing the emitter material layers on the second surface S and the lateral surfaces C of the substrate 10 in a trough machine, and etching the pyramid shaped textured structures 22 on the second surface S and the lateral surfaces C into the pyramid base shaped textured structures 20, a temperature in the etching step performed in the trough machine ranges from 45° C. to 90° C., and etching is performed through a first etching solution; wherein the first etching solution includes a NaOH or KOH solution with a concentration of 5% to 20% (further, the concentration is 8%) and an organic complex additive.

By adding the organic complex additive to the above first etching solution, the organic complex additive may specifically include a cationic surfactant, sodium glycolate, and sodium formate. In this way, the steps of etching and removing the emitter material layers and etching the pyramid shaped textured structures 22 into the pyramid base shaped textured structures 20 can be completed in a same etching process by controlling an etching speed and an etching direction, and the maximum side length L2 of each of the top surfaces of the pyramid base shaped textured structures 20 on the second surface S and the lateral surfaces C etched satisfies: L2<15 μm.

In the embodiments of the present disclosure, in step S30, the step of forming a passivated contact material layer on the second surface S of the substrate 10 includes:

sequentially stacking and forming a tunnel material layer, a polysilicon doped material layer, and a second oxide material layer (which may be, for example, phosphosilicate glass (PSG)) on the second surface S of the substrate 10.

In step S40, referring to FIG. 7, the step of etching and removing the passivated contact material layer wraparound deposited on one side of the first surface F and the lateral surfaces C of the substrate 10 and etching the pyramid base shaped textured structures 20 on the lateral surfaces C includes:

etching and removing the second oxide material layers wraparound deposited on the first surface F and the lateral surfaces C of the substrate 10 in a chain machine; and etching and removing the tunnel material layer and the polysilicon doped material layer wraparound deposited on the first surface F and the lateral surfaces C of the substrate 10 in a trough machine, and etching the pyramid base shaped textured structures 20 on the lateral surfaces C. In this way, the passivated contact layer 50 can be formed.

Further, in the step of etching and removing the tunnel material layer and the polysilicon doped material layer wraparound deposited on the first surface F and the lateral surfaces C of the substrate 10 in a trough machine, and etching the pyramid base shaped textured structures 20 on the lateral surfaces C, the etching is performed through a second etching solution, wherein the second etching solution includes a KOH or NaOH solution with a concentration of 5% to 30%, ethylenediaminetetraacetic acid disodium salt, polysaccharide, and sodium formate.

By adding ethylenediaminetetraacetic acid disodium salt, polysaccharide, and sodium formate to the above second etching solution, steps of etching away the tunnel material layer and the polysilicon doping material layer and further etching the pyramid base shaped textured structures 20 on the lateral surfaces C can be completed in a same etching process by controlling an etching speed and an etching direction, and the maximum side length L1 of each of the top surfaces of the pyramid base shaped textured structures 20 on the lateral surfaces C etched satisfies: L1>15 μm.

Further, in the step of etching and removing the second oxide material layers wraparound deposited on the first surface F and the lateral surfaces C of the substrate 10 in a chain machine, an HF solution with a concentration of 2% to 35% is used for etching in the etching step performed in the chain machine.

The manufacturing method of a solar cell in the embodiments of the present disclosure is described below with a specific example. The method includes the following steps.

In step I, referring to FIG. 5, a substrate 10 is textured and boron-diffused, pyramid shaped textured structure 22 are formed on each surface of the substrate 10, and element-doped conductive material layers 31 are stacked and formed on each surface of the substrate 10, to form a base plate 101.

In step II, referring to FIG. 6, the first oxide material layers on the second surface S and the lateral surfaces C of the substrate 10 are etched and removed in a chain machine, and an HF solution with a concentration of 2% to 35% is used for etching in the etching step.

The emitter material layers on the second surface S and the lateral surfaces C of the substrate 10 are etched and removed in a trough machine, and the pyramid shaped textured structures 22 on the second surface S and the lateral surfaces C are etched into the pyramid base shaped textured structures 20. Therefore, a textured layer 21 and the doped conductive layer 30 are formed, and any side length L4 of each of the top surfaces of the pyramid base shaped textured structures 20 arranged on the second surface S satisfies: 7 μm≤L4≤10 μm. A temperature of the etching ranges from 45° C. to 90° C., and the etching is performed through a first etching solution. The first etching solution includes a NaOH or KOH solution with a concentration of 5% to 20% (further, the concentration is 8%) and an organic complex additive.

In step III, referring to FIG. 7, a tunnel material layer, a polysilicon doped material layer, and a second oxide material layer are sequentially stacked on the second surface S of the substrate 10.

In step IV, the second oxide material layers on the first surface F and the lateral surfaces C of the substrate 10 are etched and removed in the chain machine, and an HF solution with a concentration of 2% to 35% is used for etching in the etching step.

The tunnel material layer and the polysilicon doped material layer wraparound deposited on the first surface F and the lateral surfaces C of the substrate 10 are etched and removed in a trough machine, and the pyramid base shaped textured structures 20 on the lateral surfaces C are etched, to form the passivated contact layer 50, and any side length L3 of each of the top surfaces of the pyramid base shaped textured structures 20 arranged on the lateral surfaces C satisfies: 15 μm<L3≤40 μm.

The etching is performed through a second etching solution. The second etching solution includes a KOH or NaOH solution with a concentration of 5% to 30%, ethylenediaminetetraacetic acid disodium salt, polysaccharide, and sodium formate.

In this case, etching and removing the BSG on one side of the first surface F and the PSG on one side of the second surface S of the substrate 10 may also be taken into account.

In step V, referring to FIG. 1 and FIG. 8 together, a first passivation film layer 40 is formed on the doped conductive layer 30, and a second passivation film layer 60 is formed on the passivated contact layer 50.

In step VI, referring to FIG. 1, a first electrode 71 and a second electrode 72 are manufactured on the first passivation film layer 40 and the second passivation film layer 60 respectively.

The solar cell 100 manufactured through step I to step VI above is tested for battery performance with the solar cell in the prior art. Compared with the solar cell in the prior art, a reverse current IRev2 of the solar cell 100 in the embodiments of the present disclosure is reduced from 0.08 A to 0.04 A, and in a mass production line, a proportion of the reverse current IRev2 greater than 1 is reduced from 1.3% to 0.03%. As can be seen, the solar cell 100 manufactured with the method in this embodiment has higher efficiency.

In a third aspect of the present disclosure, a solar cell 100 is provided. On the basis of the foregoing solar cell 100, sizes of the plurality of pyramid base shaped textured structures 20 arranged on the second surface S and the lateral surfaces C are improved. Other structures included in the solar cell 100 and the manufacturing method of a solar cell are similar to those in the foregoing embodiments. Details are not described herein again. Exemplarily, a perimeter of each of top surfaces of the pyramid base shaped textured structures 20 arranged on the lateral surfaces is C1, a perimeter of each of top surfaces of the pyramid base shaped textured structures 20 arranged on the second surface S is C2, and C1>C2.

Similar to the above, since the plurality of pyramid base shaped textured structures 20 are pyramid base shaped structures formed after the pyramid shaped textured structures 22 are polished, if the perimeter of the top surface of each of the pyramid base shaped textured structures 20 is longer, a protruding height of each of the pyramid base shaped textured structures 20 correspondingly formed is lower, and a degree of etching is higher. On the contrary, if the perimeter of the top surface of each of the pyramid base shaped textured structures 20 is shorter, the protruding height of each of the pyramid base shaped textured structures 20 correspondingly formed is higher, and the degree of etching is lower. By making C1>C2, that is, making the perimeters of the top surfaces of the pyramid base shaped textured structures 20 arranged on the lateral surfaces C being greater than the perimeters of the top surfaces of the pyramid base shaped textured structures 20 arranged on the second surface S, the heights of the pyramid base shaped textured structures 20 formed on the lateral surfaces C are lower than the heights of the pyramid base shaped textured structures 20 formed on the second surface S. That is, compared with the second surface S, the lateral surfaces C are etched to a higher degree. As such, during formation of the polysilicon doped conductive layer 52, portions of the lateral surfaces C of the substrate 10 where doping elements diffuse into can be removed by etching as much as possible, which can prevent formation of leakage channels on the lateral surfaces C, thereby improving efficiency of the solar cell 100.

In a fourth aspect of the embodiments of the present disclosure, a photovoltaic module (not shown) is provided. The photovoltaic module includes at least one cell string. The cell string includes at least two solar cells 100 as described above. The solar cells 100 are connected together by series soldering.

In a fifth aspect of the embodiments of the present disclosure, a photovoltaic system (not shown) is provided. The photovoltaic system includes the photovoltaic module described above.

The photovoltaic system may be applied to photovoltaic power stations, such as ground power stations, rooftop power stations, and water surface power stations, or applied to devices or apparatuses that use solar energy to generate electricity, such as user solar power supplies, solar street lights, solar cars, and solar buildings. Certainly, it may be understood that application scenarios of the photovoltaic system are not limited thereto. In other words, the photovoltaic system may be applied to all fields required to use solar energy to generate electricity. Taking a photovoltaic power generation network as an example, the photovoltaic system may include a photovoltaic array, a combiner box, and an inverter. The photovoltaic array may be an array of a plurality of photovoltaic modules. For example, the plurality of photovoltaic modules may form a plurality of photovoltaic arrays. The photovoltaic arrays are connected to the combiner box, and the combiner box may combine currents generated by the photovoltaic arrays. The combined current flows through the inverter and is converted into an alternating current suitable for a power grid, and then connected to the power grid to realize solar power supply.

The technical features of the above-mentioned embodiments can be combined arbitrarily. In order to make the description concise, not all possible combinations of the technical features are described in the embodiments. However, as long as there is no contradiction in the combination of these technical features, the combinations should be considered as in the scope of the specification.

The above-described embodiments are only several implementations of the present disclosure, and the descriptions are relatively specific and detailed, but they should not be construed as limiting the scope of the present disclosure. It should be understood by those of ordinary skill in the art that various modifications and improvements can be made without departing from the concept of the present disclosure, and all fall within the protection scope of the present disclosure. Therefore, the patent protection of the present disclosure shall be defined by the appended claims.

The invention claimed is:

1. A solar cell, comprising:
a substrate comprising a first surface and a second surface arranged opposite to each other and a plurality of lateral surfaces adjacent to and located between the first surface and the second surface; a plurality of pyramid base shaped textured structures being constructed on the second surface and each of the lateral surfaces, wherein each of the pyramid base shaped textured structures has a shape of a truncated pyramid and has a top surface, and wherein a minimum side length of each of the top surfaces of the pyramid base shaped textured structures arranged on the lateral surfaces is L1, a maximum side length of each of the top surfaces of the pyramid base shaped textured structures arranged on the second surface is L2, and L1>L2;
a doped conductive layer arranged on the first surface; and
a passivated contact layer comprising a polysilicon doped conductive layer, the passivated contact layer being arranged on the second surface.

2. The solar cell according to claim 1, wherein the minimum side length L1 of each of the top surfaces of the pyramid base shaped textured structures arranged on the lateral surfaces satisfies: L1>15 µm.

3. The solar cell according to claim 2, wherein any side length L3 of each of the top surfaces of the pyramid base shaped textured structures arranged on the lateral surfaces satisfies: 15 µm<L3≤40 µm.

4. The solar cell according to claim 1, wherein the maximum side length L2 of each of the top surfaces of the pyramid base shaped textured structures arranged on the second surface satisfies: L2<15 µm.

5. The solar cell according to claim 4, wherein any side length L4 of each of the top surfaces of the pyramid base shaped textured structures arranged on the second surface satisfies: 7 µm≤L4≤10 µm.

6. The solar cell according to claim 1, wherein a top end of each of the pyramid base shaped textured structures is provided with depressions, and a depression depth D of each of the depressions satisfies: 50 nm≤D≤1000 nm.

7. The solar cell according to claim 1, wherein the solar cell further comprises:
a first passivation film layer stacked on the doped conductive layer; and
a second passivation film layer stacked on the passivated contact layer.

8. A solar cell, comprising:
a substrate comprising a first surface and a second surface arranged opposite to each other and a plurality of lateral surfaces adjacent to and located between the first surface and the second surface; a plurality of pyramid base shaped textured structures being constructed on the second surface and each of the lateral surfaces, wherein each of the pyramid base shaped textured structures has a shape of a truncated pyramid and has a top surface, wherein a perimeter of each of the top surfaces of the pyramid base shaped textured structures arranged on the lateral surfaces is C1, a perimeter of each of the top surfaces of the pyramid base shaped textured structures arranged on the second surface is C2, and C1>C2;
a doped conductive layer arranged on the first surface; and
a passivated contact layer comprising a polysilicon doped conductive layer, the passivated contact layer being arranged on the second surface.

9. A manufacturing method of a solar cell, comprising:
providing a base plate, the base plate comprising a substrate, pyramid shaped textured structures being constructed on surfaces of the substrate, element-doped conductive material layers being stacked on the surfaces of the substrate, the surfaces of the substrate comprising a first surface and a second surface arranged opposite to each other and a plurality of lateral surfaces adjacent to and located between the first surface and the second surface;
etching and removing the element-doped conductive material layers on the second surface and the lateral surfaces, and etching the pyramid shaped textured structures on the second surface and the lateral surfaces into pyramid base shaped textured structures, to form a doped conductive layer on the first surface of the substrate, wherein each of the pyramid base shaped textured structures has a shape of a truncated pyramid and has a top surface;
forming a passivated contact material layer on the second surface of the substrate, so that the passivated contact material layer is formed on the second surface of the substrate and the passivated contact material layer is further wraparound deposited onto the first surface and the lateral surfaces of the substrate, the passivated contact material layer comprising a polysilicon doped conductive material layer; and
etching and removing the passivated contact material layer wraparound deposited on the first surface and the lateral surfaces of the substrate and etching the pyramid base shaped textured structures on the lateral surfaces, to form a passivated contact layer comprising a polysilicon doped conductive material layer on the second surface, and to make a minimum side length L1 of each of the top surfaces of the pyramid base shaped textured structures arranged on the lateral surfaces and a maximum side length L2 of each of the top surfaces of the pyramid base shaped textured structures arranged on the second surface satisfying: L1>L2.

10. The manufacturing method of a solar cell according to claim 9, wherein the element-doped conductive material layers each comprise an emitter material layer and a first oxide material layer located on a side of the emitter material layer that faces away from the pyramid shaped textured structures; and
the step of etching and removing the element-doped conductive material layers on the second surface and the lateral surfaces, and the etching the pyramid shaped textured structures on the second surface and the lateral surfaces into pyramid base shaped textured structures comprises:
etching and removing the first oxide material layers on the second surface and the lateral surfaces of the substrate in a chain machine; and
etching and removing the emitter material layers on the second surface and the lateral surfaces of the substrate in a trough machine, and etching the pyramid shaped textured structures on the second surface and the lateral surfaces into the pyramid base shaped textured structures.

11. The manufacturing method of a solar cell according to claim 10, wherein in the step of etching and removing the first oxide material layers on the second surface and the lateral surfaces of the substrate in the chain machine,
an HF solution with a concentration of 2% to 35% is used for etching in the step of the etching performed in the chain machine.

12. The manufacturing method of a solar cell according to claim 10, wherein in the step of etching and removing the emitter material layers on the second surface and the lateral surfaces of the substrate in the trough machine, and the etching the pyramid shaped textured structures on the second surface and the lateral surfaces into the pyramid base shaped textured structures,
a temperature under which the step of etching is performed in the trough machine ranges from 45° C. to 90° C., and the etching is performed through a first etching solution; wherein the first etching solution comprises a NaOH or KOH solution with a concentration of 5% to 20% and an organic complex additive.

13. The manufacturing method of a solar cell according to claim 12, wherein the organic complex additive comprises a cationic surfactant, sodium glycolate, and sodium formate.

14. The manufacturing method of a solar cell according to claim 9, wherein the step of forming the passivated contact material layer on the second surface of the substrate comprises:
sequentially stacking and forming a tunnel material layer, a polysilicon doped material layer, and a second oxide material layer on the second surface of the substrate; and
the step of etching and removing the passivated contact material layer wraparound deposited on the first surface and the lateral surfaces of the substrate and the etching the pyramid base shaped textured structures on the lateral surfaces comprises:
etching and removing the second oxide material layers wraparound deposited on the first surface and the lateral surfaces of the substrate in a chain machine; and
etching and removing the tunnel material layer and the polysilicon doped material layer wraparound deposited on the first surface and the lateral surfaces of the substrate in a trough machine, and etching the pyramid base shaped textured structures on the lateral surfaces.

15. The manufacturing method of a solar cell according to claim 14, wherein in the step of etching and removing the tunnel material layer and the polysilicon doped material layer wraparound deposited on the first surface and the lateral surfaces of the substrate in the trough machine, and etching the pyramid base shaped textured structures on the lateral surfaces,
the etching is performed through a second etching solution, wherein the second etching solution comprises a KOH or NaOH solution with a concentration of 5% to 30%, and ethylenediamine tetraacetic acid disodium salt, polysaccharide, and sodium formate.

16. A photovoltaic module, comprising at least one cell string, each of the at least one cell string comprising at least two solar cells according to claim 1.

17. A photovoltaic system, comprising the photovoltaic module according to claim 16.

18. The solar cell according to claim 1, wherein the lateral surfaces extend from the first surface to the second surface.

19. The solar cell according to claim 8, wherein the lateral surfaces extend from the first surface to the second surface.

* * * * *